United States Patent [19]
Ledzius et al.

[11] Patent Number: 5,122,799
[45] Date of Patent: Jun. 16, 1992

[54] MULTI-MODULATOR DIGITAL-TO-ANALOG CONVERTER

[75] Inventors: Robert C. Ledzius, Austin; James S. Irwin, Paige, both of Tex.

[73] Assignee: Motorola, Inc., Schaumburg, Ill.

[21] Appl. No.: 632,772

[22] Filed: Dec. 24, 1990

[51] Int. Cl.⁵ ............................................. H03M 1/68
[52] U.S. Cl. ..................................... 341/143; 341/145
[58] Field of Search ................. 341/143, 144, 145, 152

[56] References Cited

U.S. PATENT DOCUMENTS 4,595,910  6/1986  Wine ................................... 341/152

FOREIGN PATENT DOCUMENTS 0118762  9/1984  European Pat. Off. ............. 341/144
58-17722  7/1983  Japan ................................... 341/145
1-58125  3/1989  Japan ................................... 341/152

OTHER PUBLICATIONS

Ritchie, et al., "Interpolative Digital-to-Analog Converters," Nov. 1974, IEEE Transactions on Communications, vol. COM 22,-No. 11 pp. 1797-1806.

*Primary Examiner*—Howard L. Williams
*Attorney, Agent, or Firm*—Paul J. Polansky

[57] ABSTRACT

A digital signal having a plurality of bits is apportioned by the DAC into a plurality of words, at least one of which has a plurality of bits. Each of the plurality of words is then processed in an energy signal producing means, such as a $\Sigma$-$\Delta$ modulator, to produce an output energy signal whose time average represents the input digital word portion. The energy output signals are then summed to provide the analog signal.

9 Claims, 1 Drawing Sheet

MULTI-MODULATOR DIGITAL-TO-ANALOG CONVERTER

FIELD OF THE INVENTION

The present invention relates, in general, to modulators and, more particularly, to multi-modulator digital-to-analog converters.

BACKGROUND OF THE INVENTION

There are two basic techniques used in digital-to-analog convertors (DACs). These are the sigma-delta ($\Sigma$-$\Delta$) and resistive or capacitive divider techniques.

For the resistive divider technique, a relatively simple DAC comprises a digital buffer register and a resistor network for simultaneously coupling outputs of different resister stages through a common circuit node to an output connection. For these types of devices, the output accuracy is greatly influenced by the ratios among the resistances of the weighted resistors of various sizes employed in the resistor networks. High levels of accuracy are difficult to achieve and expensive, particularly with faster 16 bit processing.

The $\Sigma$-$\Delta$ technique is attractive because it achieves high resolution by precise timing instead of precisely matched on-chip components (resistors). In addition, the expertise needed to produce thin film, laser trimmed analog components are difficult to obtain; whereas, high speed digital switching capability is commonplace in the semiconductor industry.

A basic $\Sigma$-$\Delta$ DAC receives a digital signal which is summed with the inverse feedback of the analog output signal (after being reconverted to a digital signal) to provide an error signal. The error signal is then processed through an integrator and a comparator to provide the analog output signal. The analog signal is also processed through an analog-to-digital convertor (ADC) to provide the feedback signal.

SUMMARY OF THE INVENTION

A digital signal having a plurality of bits is apportioned by the DAC into a plurality of words, at least one of which has a plurality of bits. Each of the plurality of words is then processed in a pulse producing means, such as a $\Sigma$-$\Delta$ modulator, to produce an output energy signal, the time average of which represents the input digital words. The energy output signals are then summed to provide the analog signal.

DETAILED DESCRIPTION OF THE DRAWINGS

Figure 1:
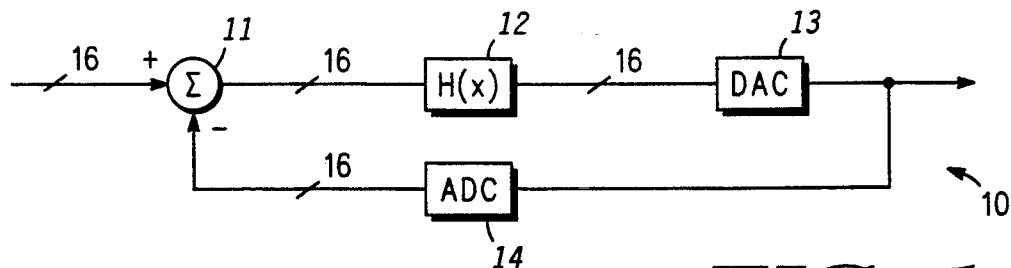
FIG. 1 is a block diagram of a prior art $\Sigma$-$\Delta$ DAC.

Referring initially to FIG. 1, a block diagram of a prior art modulator, generally designated 10, is illustrated. Modulator 10 receives a digital input (a 16 bit input is illustrated) at a summing device 11. Here, the input digital signal is summed with the inverse of a feedback signal to produce an error signal. The error signal is then transmitted through a filter 12 to a DAC quantizer 13. DAC 13 converts the digital signal to an analog signal which is output from modulator 10, typically to an analog low pass filter such as an Integrate, Sample, and Dump (ISD) circuit, not shown. The output is also transmitted to an ADC 14 where it is reconverted to a digital signal. The digital signal from ADC 14 is then used as the feedback signal at summing device 11.

While a single-bit $\Sigma$-$\Delta$ modulator is easier to manufacture than the resistive network type of DAC, there is the addition of quantization error from the quantizer. In practice this error will also be returned to the summing device through the feedback signal and cause the input signal to be compensated accordingly.

A $\Sigma$-$\Delta$ modulator typically provides successive coarse approximations of the output. As is known in the art, the coarseness of the curve can be smoothed out by oversampling. This is accomplished by having the sampling clock run above the Nyquist sampling rate which, for typical audio applications having a bandwidth of 24 kHz, would be 48 kHz. In an 8-bit system, each word would then be sampled 256 times ($2^8$) which would ideally require a clock rate of $256 \times 48$ kHz or 12.288 MHz. Since this clock frequency is achievable by most manufactures, an 8-bit converter does not pose a problem. However, in a 16-bit converter, the sampling rate would ideally be 65536 times ($2^{16}$) and require a clock frequency of $65536 \times 48$ kHz or approximately 3.15 GHz, which is beyond the reach of current technology. Accepting a sampling rate less than the ideal is adequate for most input values, but under specific inputs may lead to undesirable audible patterns or tones.

Figure 2:
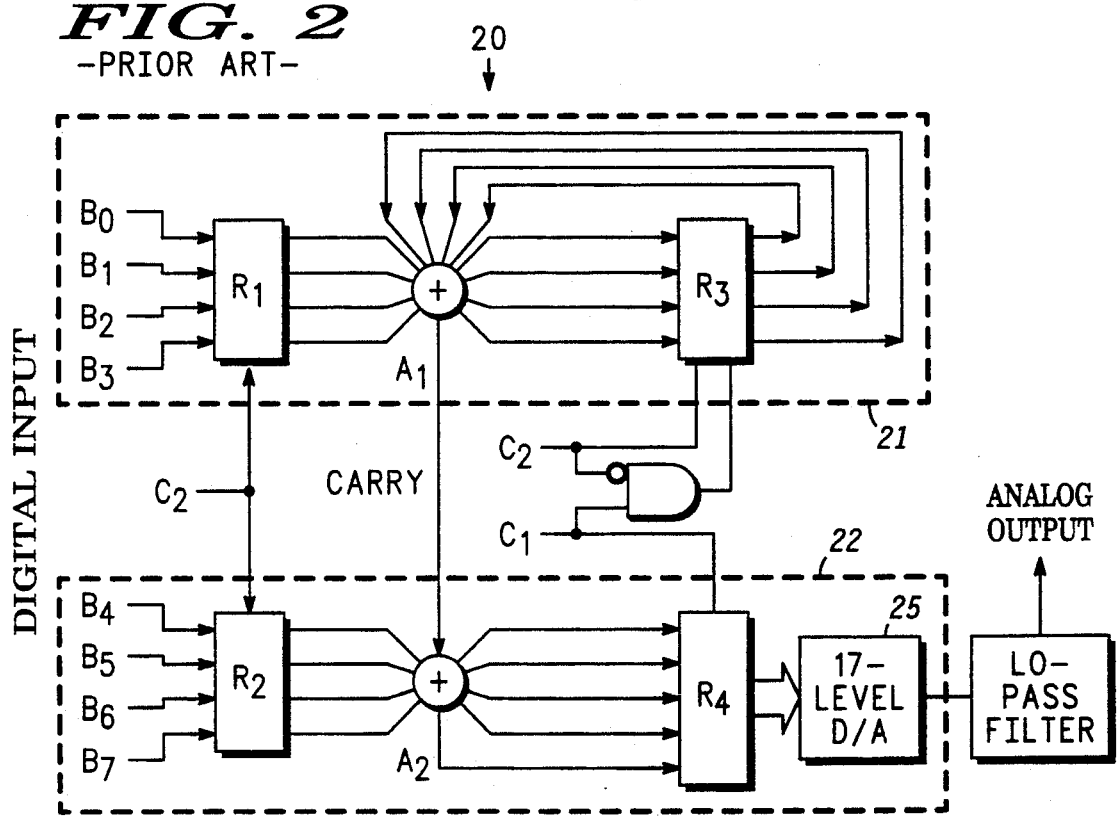
FIG. 2 is a block diagram of a prior art DAC comprising a resistive network and a $\Sigma$-$\Delta$ modulator.

One way in which to alleviate the quantization error problem and the tonal problem is through the use of a combination modulator using both a resistive network and a $\Sigma$-$\Delta$ modulator. A modulator, generally designated 20, is shown in FIG. 2 and described in detail by Ritchie et al. in "Interpolative Digital-to-Analog Converters", IEEE Transactions on Communications, Vol. Com-22, No. 11 (11/74). Modulator 20 consists of a resistive portion 22 having a resistive network 25, which receives the most significant bit portion of the input, and a $\Sigma$-$\Delta$ portion 21 which receives the least significant portion of the input. Here, resistive portion 22 provides the course adjustments while $\Sigma$-$\Delta$ portion 21 provides the fine tuning signal to portion 22 analog line $A_1$. For this 8-bit configuration, the 4-bit resistive network used to process the most significant portion has fewer resistive components than an 8-bit resistive divider DAC, but still requires accuracy to the desired final resolution.

Figure 3:
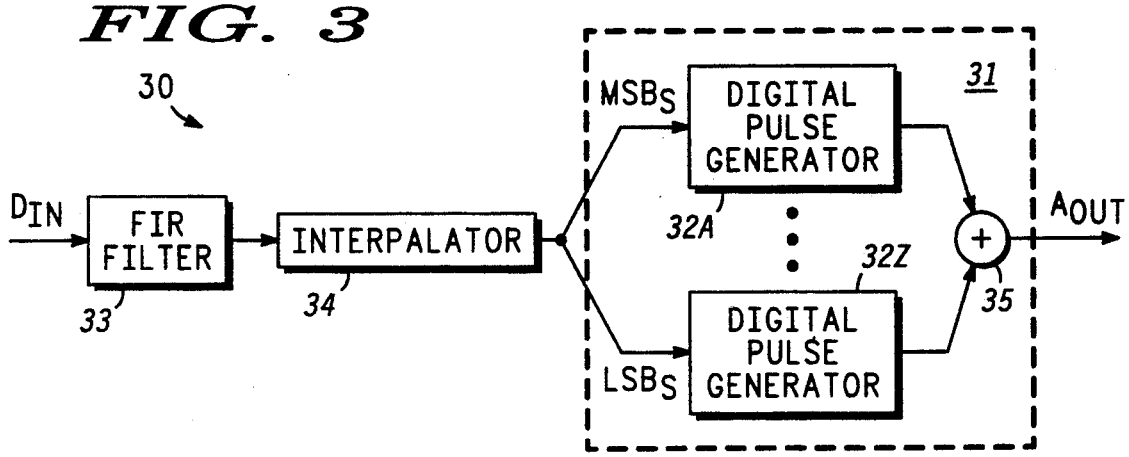
FIG. 3 is a block diagram of a DAC embodying the present invention.

Referring now to FIG. 3, a circuit, generally designated 30, having a multi-modulator 31 embodying the present invention is illustrated. Also included in circuit 30 is a finite impulse response (FIR) filter 33 and an interpolator 34. The input digital signal is first filtered through a low pass filter 33 to provide an output of finite duration. This digital signal is then processed through interpolator 34 which provides the digital input to multi-modulator 31.

Multi-modulator 31 is comprised of a plurality of digital pulse generators 32A–32Z. The digital input to modulator 31 is partitioned into a plurality of words. In a 16-bit application, the signal may be apportioned into two 8-bit words, but additional pulse generators 32 could be added to further apportion the input. Digital pulse generators may be simple pulse code modulators, $\Sigma$-$\Delta$ type modulators, or any other type of modulator.

Each word is then processed through a digital pulse generator 32 to provide an analog signal whose time average is an analog representation of the digital input word portion. The plurality of output energy signals are then summed in summing device 35, and the analog output is derived. The analog output would then typically be provided to an analog low pass filter, such as an Integrate, Sample, and Dump (ISD) device, not shown.

If Σ-Δ modulators were used, a clock rate of only 12.28 MHz would be needed to oversample the signal since each of the modulators is only processing an 8-bit word.

Thus, it will be apparent to one skilled in the art, upon reviewing the foregoing description, that there has been provided in accordance with the invention, a process and method that fully satisfy the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A method for converting a digital signal to an analog signal in a digital-to-analog converter comprising the steps of:
   receiving said digital signal at an input of said digital-to-analog converter, said digital signal having a plurality of bits;
   partitioning said digital signal into a plurality of words wherein at least one of said words comprises a plurality of bits;
   providing each of said plurality of words to an input of a corresponding sigma delta modulator for producing an output energy signal whose time average of a sequence of one or more pulses represents said word portion of said digital signal;
   generating a plurality of output energy signals at an output of each of said sigma delta modulators, each of said plurality of output energy signals representing one of said plurality of words;
   generating said analog signal by summing said plurality of output energy signals; and
   filtering said analog signal in a low pass filter.

2. The method of claim 1 wherein in said step of partitioning, said at least one of said words is a most significant word comprising a plurality of bits including a most significant bit of said digital signal.

3. The method of claim 1 wherein each of said output energy signals is weighted to represent a significance of a corresponding one of said plurality of words.

4. The method of claim 1 further comprising the step of processing said digital signal in a finite impulse response filter prior to said digital signal being received by said digital-to-analog converter.

5. The method of claim 1 further comprising the step of processing said digital signal in an interpolator prior to said digital signal being received by said digital-to-analog converter.

6. A method for converting a digital signal, having a plurality of bits, to an analog signal comprising the steps of:
   receiving and processing said digital signal in a finite impulse response filter producing a filtered digital signal;
   processing said filtered digital signal in an interpolator producing an interpolated digital signal;
   receiving said interpolated digital signal at an input of a digital-to-analog converter;
   partitioning said digital signal into a plurality of words wherein at least one of said words comprises a plurality of bits;
   providing each of said plurality of words to an input of a corresponding pulse code modulator for producing an output energy signal whose time average of a sequence of one or more pulses of said word portion represents said digital signal;
   generating a plurality of output energy signals at an output of each of said pulse code modulators, each of said plurality of output energy signals representing one of said plurality of words;
   generating an analog signal provided by summing said plurality of output energy signals; and
   filtering said analog signal in a low pass filter.

7. The method of claim 6 wherein in said step of partitioning, said at least one of said words is a most significant word comprising a plurality of bits including a most significant bit of said digital signal.

8. The method of claim 6 wherein each of said output energy signals is weighted to represent a significance of a corresponding one of said plurality of words.

9. A method for converting a digital signal to an analog signal in a digital-to-analog converter comprising the steps of:
   receiving said digital signal at an input of said digital-to-analog converter, said digital signal having a plurality of bits;
   partitioning said digital signal into a plurality of words wherein at least one of said words comprises a plurality of bits;
   providing each of said plurality of words to an input of an energy signal producing means for producing an output energy signal whose time average of a sequence of one or more pulses represents said word portion of said digital signal;
   generating a plurality of output energy signals at an output of said energy signal producing means, each of said plurality of output energy signals representing one of said plurality of words;
   weighting each of said plurality of energy output signals to represent a significance of a corresponding one of said plurality of words; and
   generating said analog signal by summing said plurality of weighted output energy signals.

* * * * *